(12) United States Patent
Yasukawa

(10) Patent No.: US 10,128,454 B2
(45) Date of Patent: Nov. 13, 2018

(54) DISPLAY DEVICE

(71) Applicant: Japan Display Inc., Minato-ku (JP)

(72) Inventor: Koji Yasukawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/791,532

(22) Filed: Oct. 24, 2017

(65) Prior Publication Data

US 2018/0114938 A1    Apr. 26, 2018

(30) Foreign Application Priority Data

Oct. 26, 2016 (JP) ................................. 2016-209885

(51) Int. Cl.
*H01L 51/50* (2006.01)
*H01L 51/00* (2006.01)
*H01L 27/32* (2006.01)

(52) U.S. Cl.
CPC ...... *H01L 51/5004* (2013.01); *H01L 51/0032* (2013.01); *H01L 51/0048* (2013.01); *H01L 51/0054* (2013.01); *H01L 51/0059* (2013.01); *H01L 51/50* (2013.01); *H01L 51/5012* (2013.01); *H01L 51/5016* (2013.01); *H01L 51/5056* (2013.01); *H01L 51/5096* (2013.01); *H01L 27/3244* (2013.01); *H01L 51/006* (2013.01); *H01L 51/0058* (2013.01); *H01L 51/0072* (2013.01); *H01L 51/0081* (2013.01); *H01L 2251/552* (2013.01)

(58) Field of Classification Search
CPC . H01L 51/50; H01L 51/5004; H01L 51/5096; H01L 51/5012; H01L 51/5056; H01L 51/5048; H01L 51/5016; H01L 51/50352; H01L 51/0058; H01L 51/0059; H01L 51/006; H01L 51/0054
See application file for complete search history.

(56) References Cited

U.S. PATENT DOCUMENTS

| 2012/0001154 A1 | 1/2012 | Kato |
| 2014/0018536 A1 | 1/2014 | Kato |
| 2015/0287951 A1* | 10/2015 | Yamamoto .......... H01L 51/5004 257/40 |

FOREIGN PATENT DOCUMENTS

WO    2012/001969    1/2012

* cited by examiner

*Primary Examiner* — Thanhha Pham
(74) *Attorney, Agent, or Firm* — Oblon, McClelland, Maier & Neustadt, L.L.P.

(57) ABSTRACT

A display device includes an anode, a hole injection layer, a hole transport layer, a blue light emitting layer, a hole blocking layer, an electron transport layer and/or an electron injection layer, and a cathode, which are stacked in this order, and has the following characteristics (i), (ii), and (iii): (i) the hole mobility of the blue light emitting layer≥the electron mobility of the blue light emitting layer, (ii) the hole mobility of the hole transport layer≥the electron mobility of the blue light emitting layer, and (iii) |the HOMO value of the blue light emitting layer−the HOMO value of the hole blocking layer|≥0.4 eV.

5 Claims, 5 Drawing Sheets

DISPLAY DEVICE

CROSS-REFERENCE TO RELATED APPLICATION

The present application claims priority from Japanese application JP2016-209885 filed on Oct. 26, 2016, the content of which is hereby incorporated by reference into this application.

BACKGROUND OF THE INVENTION

1. Field of the Invention

The present invention relates to a display device.

2. Description of the Related Art

In a display device using organic EL (Electro Luminescence), an electrically neutral exciton is generated by hole-electron recombination in a light emitting layer. In this exciton, there exist the following two types: a luminescent singlet exciton and a non-luminescent triplet exciton. The singlet exciton can be extracted as light emission, however, the triplet exciton cannot be extracted as light emission as it is.

Recently, an attempt to improve luminous efficiency by allowing triplet excitons to collide with each other to generate singlet excitons so as to emit light (a TTF (Triplet Triplet Fusion) effect) has been made (WO 2012/001969).

SUMMARY OF THE INVENTION

The present invention provides a display device, in which the luminous efficiency of a blue light emitting layer is enhanced by an efficient TTF effect, and the service life is long.

A display device according to one embodiment of the present invention includes an anode, a hole injection layer, a hole transport layer, a blue light emitting layer, a hole blocking layer, an electron transport layer and/or an electron injection layer, and a cathode, which are stacked in this order, and has the following characteristics (i), (ii), and (iii):

(i) the hole mobility of the blue light emitting layer≥the electron mobility of the blue light emitting layer, (ii) the hole mobility of the hole transport layer≥the electron mobility of the blue light emitting layer, and (iii) |the HOMO value of the blue light emitting layer−the HOMO value of the hole blocking layers|≥0.4 eV.

According to the above-mentioned display device, since the display device has the above-mentioned characteristics (i), (ii), and (iii), an efficient TTF effect can be obtained, and therefore, the luminous efficiency can be enhanced, and also the service life can be increased by suppressing deterioration of the blue light emitting layer.

DETAILED DESCRIPTION OF THE INVENTION

Figure 1:
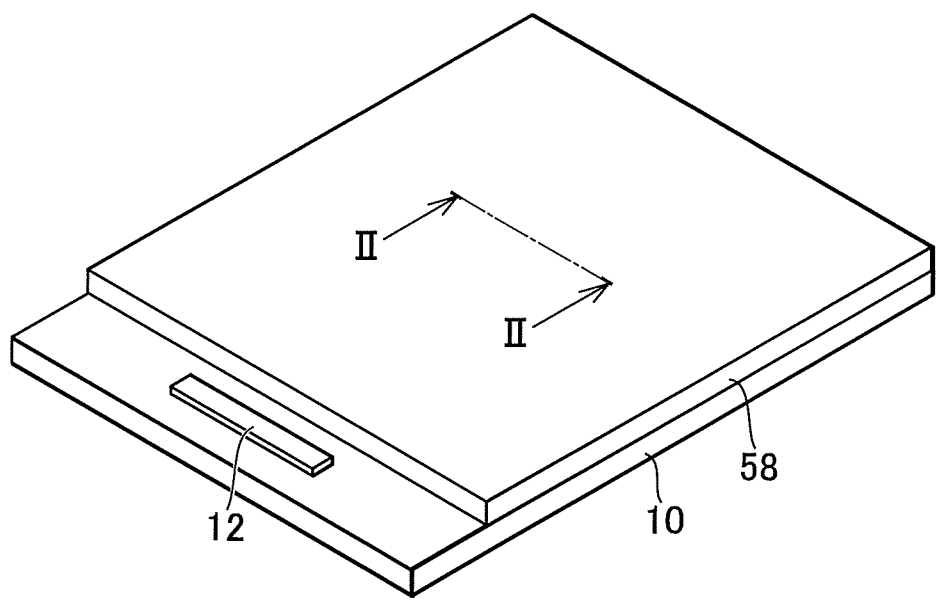
FIG. 1 is a perspective view of a display device according to an embodiment of the present invention.

Hereinafter, embodiments of the present invention will be described with reference to the drawings. However, the present invention can be carried out in various embodiments without departing from the gist of the invention and should not be construed as being limited to the contents described in the embodiments illustrated below.

The drawings are sometimes schematically shown in terms of width, thickness, shape, etc., of each section in comparison with an actual form for further clarifying the description, however, the drawings are merely examples and do not limit the interpretation of the present invention. In the specification and the respective drawings, a component having the same function as a component described with reference to the previously mentioned drawing is denoted by the same reference numeral, and a repetitive description is omitted in some cases.

Further, in the detailed description of the present invention, when the positional relationship between a certain structure and another structure is defined, the terms "on" and "under" include not only a case where the structure is positioned immediately above or immediately below the certain structure, but also include a case where still another structure is interposed therebetween unless otherwise specifically stated.

FIG. 1 is a perspective view of a display device according to an embodiment of the present invention. As the display device, an organic electroluminescence display device will be described as an example. The display device is configured to display a full-color image by combining, for example, unit pixels (sub pixels) of a plurality of colors composed of red, green, and blue to form full-color pixels. The display device includes a first substrate 10. On the first substrate 10, an integrated circuit chip 12 for driving an element for displaying an image is mounted, and a flexible printed board (not shown) for external electrical connection may be connected thereto.

Figure 2:
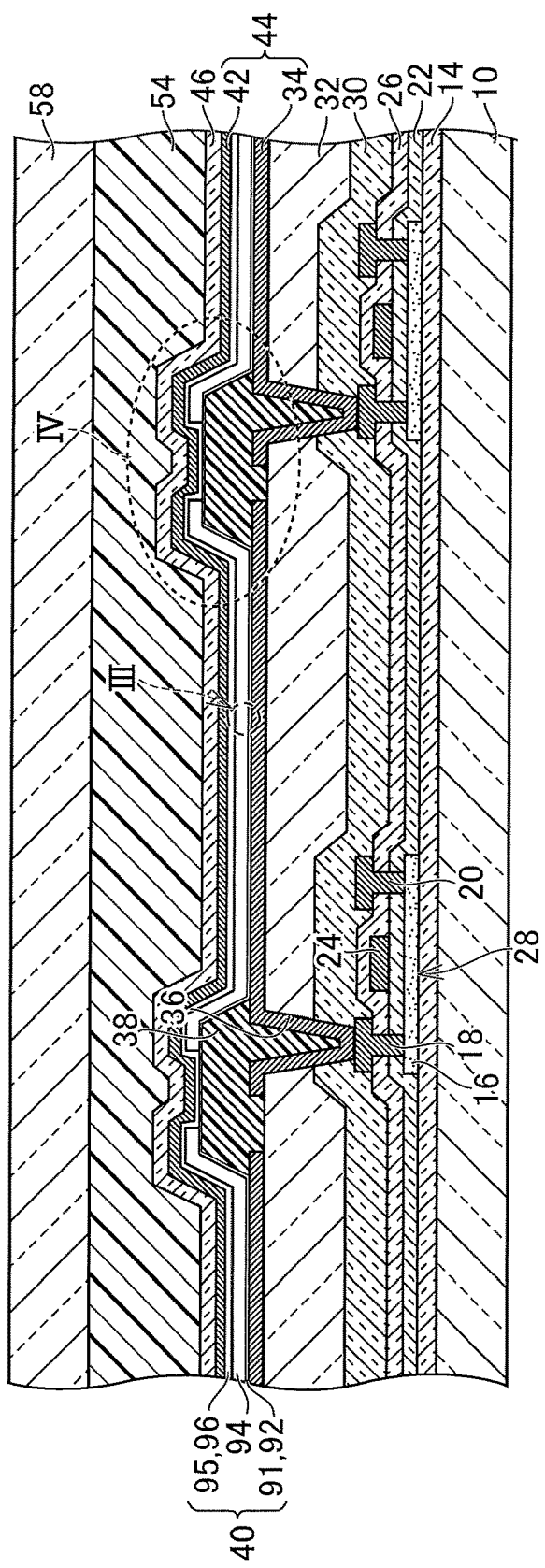
FIG. 2 is an enlarged view of a cross section taken along the line II-II of the display device shown in FIG. 1.

FIG. 2 is an enlarged view of a cross section taken along the line II-II of the display device shown in FIG. 1. On the first substrate 10, an undercoat 14 to serve as a barrier against impurities contained in the first substrate 10 is formed, and a semiconductor layer 16 is formed thereon. A source electrode 18 and a drain electrode 20 are electrically connected to the semiconductor layer 16, and a gate insulating film 22 is formed so as to cover the semiconductor layer 16. On the gate insulating film 22, a gate electrode 24 is formed, and an interlayer insulating film 26 is formed so as to cover the gate electrode 24. The source electrode 18 and the drain electrode 20 penetrate the gate insulating film 22 and the interlayer insulating film 26. The semiconductor layer 16, the source electrode 18, the drain electrode 20, and the gate electrode 24 form a thin-film transistor 28. A passivation film 30 is provided so as to cover the thin-film transistor 28.

On the passivation film 30, a planarization layer 32 is provided. On the planarization layer 32, a plurality of anodes 34 (for example, pixel electrodes) formed so as to correspond to the plurality of unit pixels, respectively. The planarization layer 32 is formed so as to planarize a surface on which at least the anodes 34 are provided. The anode 34 is electrically connected to one of the source electrode 18 and the drain electrode 20 on the semiconductor layer 16 through a contact hole 36 penetrating the planarization layer 32 and the passivation film 30.

On the planarization layer 32 and the anode 34, an insulating layer 38 is formed. The insulating layer 38 is placed on a peripheral portion of the anode 34 and is formed so as to open a portion (for example, a central portion) of the anode 34. By the insulating layer 38, a bank surrounding the portion of the anode 34 is formed.

On the anode 34, a light emitting element layer 40 is provided. The light emitting element layer 40 is provided individually (separately) for each of the anodes 34 and is also placed on the insulating layer 38. In this case, the light emitting element layer 40 emits blue, red, or green light corresponding to each pixel. Incidentally, the light emitting element layer 40 including a region surrounded by a dotted line indicated by III in FIG. 2 emits blue light.

On the light emitting element layer 40, a cathode 42 (for example, a common electrode) is provided. The cathode 42 is formed so as to be placed on the upper side of the insulating layer 38 to serve as a bank. The anode 34 and the cathode 42 sandwiching the light emitting element layer 40 and the light emitting element layer 40 form a light emitting element 44. The light emitting element layer 40 is sandwiched between the anode 34 and the cathode 42 and emits light by controlling the luminance by an electric current flowing therebetween. Between the light emitting element layer 40 and the anode 34, at least one layer of a hole transport layer (not shown) and a hole injection layer (not shown) may be provided. Between the light emitting element layer 40 and the cathode 42, at least one layer of an electron transport layer and an electron injection layer (in FIG. 3, an electron transport layer 96) is provided.

The light emitting element 44 is covered with a sealing layer 46 to be stacked on the cathode 42 so as to be sealed and is shielded from water. To the sealing layer 46, a second substrate 58 is adhered through an adhesive layer 54.

Figure 3:
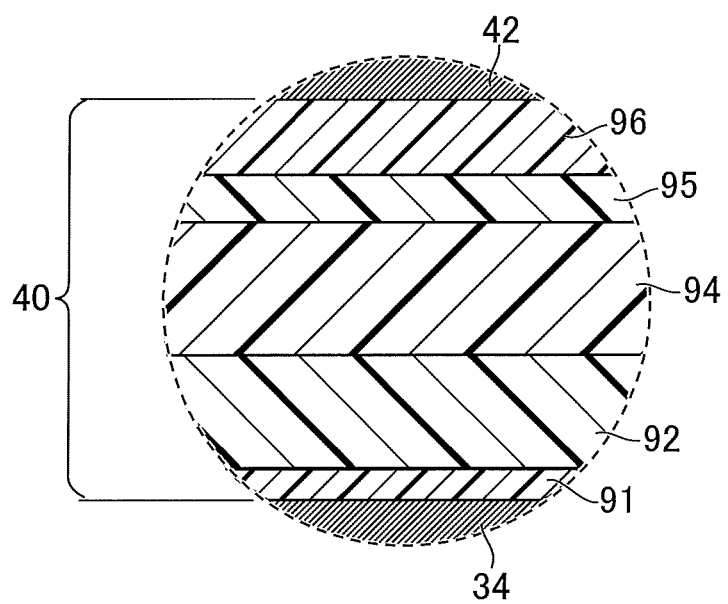
FIG. 3 is an enlarged view of a region surrounded by a dotted line indicated by III in the display device shown in FIG. 2.

FIG. 3 is an enlarged view of a region surrounded by a dotted line indicated by III in the display device shown in FIG. 2. As shown in FIG. 3, the light emitting element 44 includes a hole injection layer 91, a hole transport layer 92, a blue light emitting layer 94, a hole blocking layer 95, and an electron transport layer 96 in this order from the side closer to the anode 34 between the anode 34 and the cathode 42.

The display device according to this embodiment has the following characteristics (i), (ii), and (iii):
(i) the hole mobility of the blue light emitting layer 94≥the electron mobility of the blue light emitting layer 94,
(ii) the hole mobility of the hole transport layer 92≥the electron mobility of the blue light emitting layer 94, and
(iii) |the HOMO value of the blue light emitting layer 94−the HOMO value of the hole blocking layer 95|≥0.4 eV.

By the display device according to this embodiment, since the display device has the above-mentioned characteristics (i), (ii), and (iii), an efficient TTF effect can be obtained. That is, the density of triplet excitons can be increased, and therefore, it is possible to promote the generation of singlet excitons by allowing the triplet excitons to react with each other.

More specifically, since the display device according to this embodiment has the above-mentioned characteristic (i), holes can be retained on the side closer to the cathode 42 in the blue light emitting layer 94 (in FIG. 3, in the vicinity of the hole blocking layer 95 in the blue light emitting layer 94). Further, since the display device according to this embodiment has the above-mentioned characteristic (ii), the electron-hole recombination density in the hole transport layer 92 can be increased. In addition, since the display device according to this embodiment has the above-mentioned characteristic (iii), electron-hole recombination can be promoted.

The concentration of a host material in the blue light emitting layer 94 is preferably 3 mass % or more and 15 mass % or less.

From the viewpoint that an electron-hole recombination region can be concentrated on the cathode 42 side in the blue light emitting layer 94, the film thickness of the blue light emitting layer 94 is preferably less than 15 nm, and further, the HOMO value of the hole blocking layer 95 is preferably less than −6.2 eV.

The electron mobility of the hole blocking layer 95 is preferably, for example, $10^{-5}$ or more and $10^{-4}$ or less ($cm^2/Vs$). The following relationship is preferably satisfied: the electron mobility of the hole blocking layer 95 the electron mobility of the blue light emitting layer 94.

From the viewpoint that the TTF effect can be more efficiently obtained, the hole mobility of the hole transport layer 92 is preferably $10^{-5}$ or more and $10^{-3}$ or less ($cm^2/Vs$).

Although not shown in FIG. 3, an electron blocking layer may be provided between the blue light emitting layer 94 and the hole transport layer 92.

Figure 4:
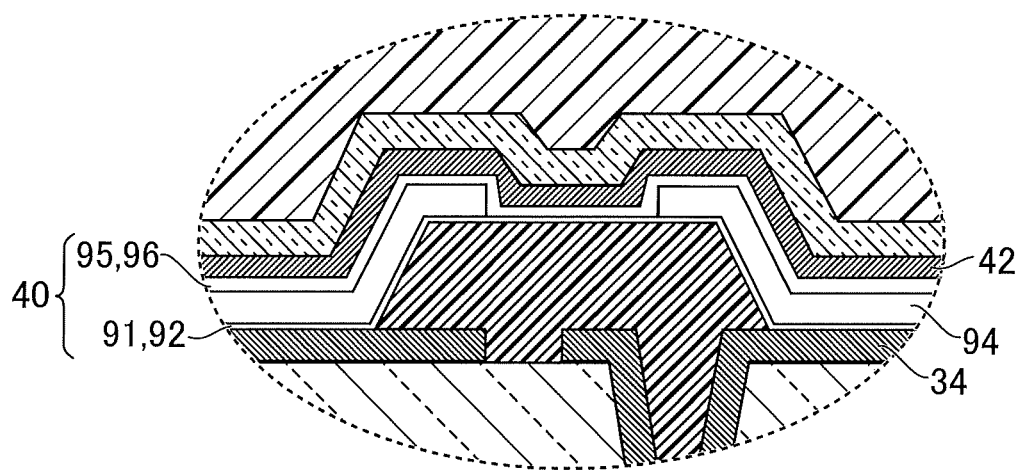
FIG. 4 is an enlarged view of a region surrounded by a dotted line indicated by IV in the display device shown in FIG. 2.
Figure 5:
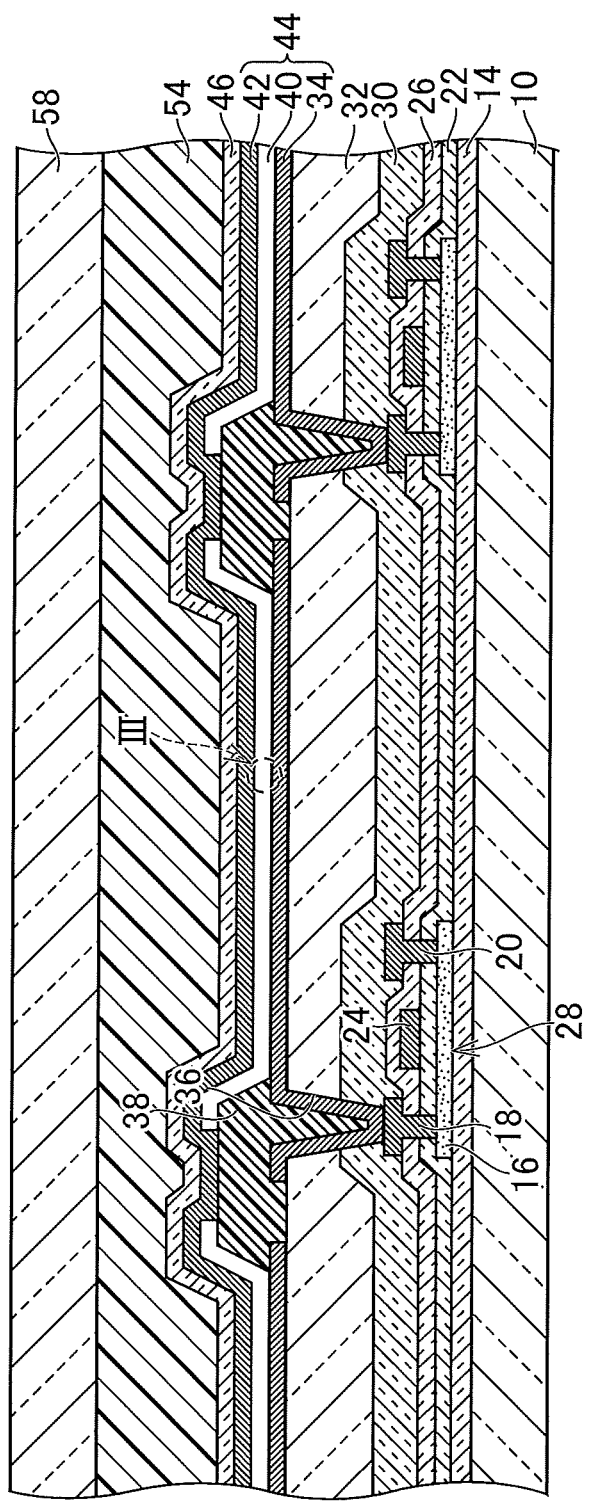
FIG. 5 is an enlarged view of the same cross section as in FIG. 2 in a display device according to another embodiment of the present invention.

Further, in the display device shown in FIG. 1, an example in which the hole injection layer 91, the hole transport layer 92, the blue light emitting layer 94, the hole blocking layer 95, and the electron transport layer 96 are provided on the anode 34 as the light emitting element layer 40 is shown, however, as the display device shown in FIG. 4, a configuration in which the hole injection layer 91 and the hole transport layer 92 are provided on the anode 34, and the blue light emitting layer 94 is provided thereon, and further, the hole blocking layer 95 and the electron transport layer 96 are provided on the blue light emitting layer 94 may be adopted.

In the display device according to this embodiment, the film thicknesses of the hole injection layer 91, the hole transport layer 92, the blue light emitting layer 94, the hole blocking layer 95, and the electron transport layer 96 can be set to, for example, 1 nm or more and 10 nm or less, 20 nm or more 150 nm or less, 5 nm or more and 30 nm or less, 10 nm or more and 40 nm or less, and 5 nm or more and 40 nm or less, respectively.

The various parameters of the respective layers forming the display device according to this embodiment are shown in Table 1.

TABLE 1

| | Hole injection layer | Hole transport layer | Host material of blue light emitting layer | Blue fluorescent dopant λmax <470 nm | Hole blocking layer | Electron transport layer |
|---|---|---|---|---|---|---|
| HOMO (eV) | — | −5.1 to −5.9 | −5.7 to −6.3 | −5.3 to −6.2 | −6.2 to −6.4 | −5.6 to −6.3 |
| LUMO (eV) | −5.3 to −5.7 | −2.0 to −2.5 | −2.7 to −3.3 | −2.6 to −3.3 | −2.5 to −3.1 | −2.5 to −3.1 |
| T1 (eV) triplet energy level | — | — | >1.8 | >1.8 | >2.5 | — |

TABLE 1-continued

| | Hole injection layer | Hole transport layer | Host material of blue light emitting layer | Blue fluorescent dopant λmax <470 nm | Hole blocking layer | Electron transport layer |
|---|---|---|---|---|---|---|
| Hole mobility $\mu_0$ @ 0.25 MV/cm (cm²/Vs) | — | $10^{-5}$ to $10^{-3}$ | $10^{-5}$ to $10^{-3}$ | — | — | — |
| Electron mobility $\mu_0$ @ 0.25 MV/cm (cm²/Vs) | — | — | $10^{-7}$ to $10^{-5}$ | — | $10^{-5}$ to $10^{-4}$ | $10^{-6}$ to $10^{-5}$ |
| Absolute value difference of HOMO between adjacent layers and absolute value difference of LUMO between adjacent layers (however, with respect to hole injection layer and hole transport layer, level difference between LUMO of hole injection layer and HOMO of hole transport layer) | colspan 0.3 eV or less | | | | | |

As the materials contained in the respective layers forming the display device according to this embodiment, for example, materials shown in the below-mentioned Examples can be used.

The display device is not limited to the organic electroluminescence display device, and may be a display device in which a light emitting element such as a quantum-dot light emitting diode (QLED) is provided for each pixel, or may be a liquid crystal display device.

EXAMPLES

Hereinafter, with reference to the drawings, the present invention will be described in further detail by way of Examples, however, the present invention is not limited to the following Examples.

By using the materials shown in Table 2, display devices including the respective layers having the parameters shown in Table 3 were fabricated (Examples 1 to 4 and Comparative Example 1). In Table 3, the hole mobility and the electron mobility are values at 0.25 MV/cm (cm²/Vs). Further, the film thickness of each layer is as described in the above-mentioned embodiment.

In Table 2, the abbreviations of the materials are as follows: HAT-CN (a hole injection layer material: 2,3,6,7,10,11-hexacyano-1,4,5,8,9,12-hexaazatriphenylene, CAS: 105598-27-4), NPB (a hole transport layer material: N,N-di(naphthalene-1-yl)-N,N-diphenyl-benzidene), HTEB03 (an electron blocking layer material, Kanto Chemical Co., Inc.), CBP (a host material of a blue light emitting layer: 4,4'-N,N'-dicarbazolylbiphenyl), BD102 (a blue fluorescent light emitting material as a dopant of a blue light emitting layer, Idemitsu Kosan Co., Ltd.), and Alq3 (an electron transport layer material: tris(8-hydroxyquinolinato)aluminum).

TABLE 2

| | Hole injection layer | Hole transport layer | Blue light emitting layer | Hole blocking layer | Electron transport layer |
|---|---|---|---|---|---|
| Example 1 | HAT-CN | NPB | CBP + HTEB103 (CBP/HTEB = 9/1 (w/w)) | BD102 | Alq3 |
| Example 2 | | | CBP + HTEB103 (CBP/HTEB = 8/2 (w/w)) | | |
| Example 3 | | | CBP + HTEB103 (CBP/HTEB = 7/3 (w/w)) | | |
| Example 4 | | | CBP + HTEB103 (CBP/HTEB = 5/5 (w/w)) | | |
| Comparative Example 1 | | | CBP | | |

TABLE 3

| | | Hole injection layer | Hole transport layer | Host material of blue light emitting layer | Hole blocking layer | Electron transport layer | Cathode | Luminous efficiency (cd/A) | TTF-derived light emission ratio (%) | Service life LT95 (hours) |
|---|---|---|---|---|---|---|---|---|---|---|
| Example 1 | HOMO/LUMO | —/−5.3 | −5.3/−2.7 | −5.9/−2.8 | −6.0/−2.9 | −5.6/−2.9 | LiF/MgAg | 3.4 | 11.0 | 600 |
| | T1 (eV) | — | 2.3 | 1.8 | 2.5 | — | | | | |
| | Hole mobility | — | $10^{-5}$ | $10^{-6}$ | — | — | | | | |
| | Electron mobility | — | — | $10^{-7}$ | $10^{-5}$ | $10^{-6}$ | | | | |

TABLE 3-continued

| | | Hole injection layer | Hole transport layer | Host material of blue light emitting layer | Hole blocking layer | Electron transport layer | Cathode | Luminous efficiency (cd/A) | TTF-derived light emission ratio (%) | Service life LT95 (hours) |
|---|---|---|---|---|---|---|---|---|---|---|
| Example 2 | HOMO/LUMO | —/−5.3 | −5.3/−2.7 | −5.5/−2.3 | −6.0/−2.9 | −5.6/−2.9 | LiF/MgAg | 4.3 | 18.0 | 800 |
| | T1 (eV) | — | 2.3 | 1.8 | 2.5 | — | | | | |
| | Hole mobility | — | $10^{-5}$ | $10^{-5}$ | — | — | | | | |
| | Electron mobility | — | — | $10^{-7}$ | $10^{-5}$ | $10^{-6}$ | | | | |
| Example 3 | HOMO/LUMO | —/−5.3 | −5.3/−2.7 | −5.9/−2.8 | −6.0/−2.9 | −5.6/−2.9 | LiF/MgAg | 5.5 | 20.6 | 500 |
| | T1 (eV) | — | 2.3 | 1.8 | 2.5 | — | | | | |
| | Hole mobility | — | $10^{-5}$ | $10^{-4}$ | — | — | | | | |
| | Electron mobility | — | — | $10^{-7}$ | $10^{-5}$ | $10^{-6}$ | | | | |
| Example 4 | HOMO/LUMO | —/−5.3 | −5.3/−2.7 | −5.9/−2.8 | −6.0/−2.9 | −5.6/−2.9 | LiF/MgAg | 5.8 | 23.6 | 100 |
| | T1 (eV) | — | 2.3 | 1.8 | 2.5 | — | | | | |
| | Hole mobility | — | $10^{-5}$ | $10^{-4}$ | — | — | | | | |
| | Electron mobility | — | — | $10^{-8}$ | $10^{-5}$ | $10^{-6}$ | | | | |
| Comparative Example 1 | HOMO/LUMO | —/−5.3 | −5.5/−2.3 | −5.9/−2.8 | — | −6.0/−2.9 | LiF/MgAg | 2.2 | 4.5 | 150 |
| | T1 (eV) | — | — | 1.8 | — | — | | | | |
| | Hole mobility | — | $10^{-5}$ | $10^{-9}$ | — | — | | | | |
| | Electron mobility | — | — | $10^{-6}$ | — | $10^{-6}$ | | | | |

In Examples 1 to 4 and Comparative Example 1, the cathode 42 having a stacked structure of LiF and an MgAg alloy was adopted. In the display devices of Examples 1 to 4, the TTF-derived light emission ratio accounting for the luminous efficiency was 11.0%, 18.0%, 20.6%, and 23.6%, respectively, and a sufficient TTF effect was obtained. Further, in the display devices of Examples 1 to 4, the service life property L95 (a time period in which the luminance was decreased by 5% when performing continuous lighting at a constant current density of 50 mA/cm² in an environment in which the temperature was maintained at 30° C.) was 270 hours, 390 hours, 210 hours, and 61 hours, respectively, and therefore, it was confirmed that the display devices have sufficient reliability.

On the other hand, in Comparative Example 1, a display device was fabricated in the same manner as in Example 1 except that the hole blocking layer 95 was not provided, and only CBP was used as the host material contained in the blue light emitting layer 94. When the electron blocking layer having a smaller hole mobility than the hole transport layer 92 was provided between the hole transport layer 92 and the blue light emitting layer 94, the TTF-derived light emission ratio accounting for the luminous efficiency was 2.2%, and therefore, it was found that a sufficient TTF effect is not obtained.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising an anode, a hole injection layer, a hole transport layer, a blue light emitting layer, a hole blocking layer, an electron transport layer and/or an electron injection layer, and a cathode, which are stacked in this order, and having the following characteristics (i), (ii), and (iii):
    (i) the hole mobility of the blue light emitting layer≥the electron mobility of the blue light emitting layer,
    (ii) the hole mobility of the hole transport layer≥the electron mobility of the blue light emitting layer, and
    (iii) |the HOMO value of the blue light emitting layer−the HOMO value of the hole blocking layer|≥0.4 eV.

2. The display device according to claim 1, wherein the film thickness of the blue light emitting layer is less than 15 nm.

3. The display device according to claim 1, wherein the HOMO value of the hole blocking layer is less than −6.2 eV.

4. The display device according to claim 1, wherein the electron mobility of the hole blocking layer is $10^{-5}$ or more and $10^{-4}$ or less (cm²/Vs).

5. The display device according to claim 1, wherein the following relationship is satisfied:
    the electron mobility of the hole blocking layer≥the electron mobility of the blue light emitting layer.

* * * * *